(12) United States Patent
Jessen (10) Patent No.: US 11,862,718 B2
(45) Date of Patent: Jan. 2, 2024

(54) III-NITRIDE THERMAL MANAGEMENT BASED ON ALUMINUM NITRIDE SUBSTRATES

(71) Applicant: BAE Systems Information and Electronic Systems Integration Inc., Nashua, NH (US)

(72) Inventor: Gregg H. Jessen, Nashua, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 152 days.

(21) Appl. No.: 17/068,202

(22) Filed: Oct. 12, 2020

(65) Prior Publication Data
US 2022/0115524 A1   Apr. 14, 2022

(51) Int. Cl.
*H01L 29/778* (2006.01)
*H01L 29/20* (2006.01)
(Continued)

(52) U.S. Cl.
CPC ...... *H01L 29/7786* (2013.01); *H01L 29/1079* (2013.01); *H01L 29/151* (2013.01); *H01L 29/2003* (2013.01); *H01L 29/66462* (2013.01)

(58) Field of Classification Search
CPC ............. H01L 29/7786; H01L 29/1079; H01L 29/151; H01L 29/2003; H01L 29/66462; H01L 23/3171; H01L 23/28; H01L 23/291; H01L 23/3192; H01L 29/122–127; H01L 29/15–158; H01L 29/42316; H01L 29/6656; H01L 29/66431; H01L 29/6653; H01L 29/66719; H01L 29/778–7789; H01L 29/7816; H01L 29/808; H01L 29/812; H01L 29/7783; H01L 29/4232; H01L 29/0657; H01L 29/0843; H01L 29/0684; H01L 29/0607; H01L 29/1029; H01L 29/155; H01L 29/205; H01L 29/7787; H01L 2924/13064; H01L 23/3732; H01L 23/367; H01L 23/53295; H01L 29/41725; H01L 21/02183; H01L 21/02164; H01L 21/0228; H01L 21/02274; H01L 21/02107; H01L 21/02112;
(Continued)

(56) References Cited

U.S. PATENT DOCUMENTS 9,496,197 B1     11/2016  Micovic et al.
9,774,301 B1 *    9/2017  Maalouf ........... H01L 23/49838
(Continued)

OTHER PUBLICATIONS

Takeuchi et al., Semiconductor device and method of producing the same and electronic device, 2019, foreign application JP2019-230359, pp. 1-75. (Year: 2019).*
(Continued)

*Primary Examiner* — Natalia A Gondarenko
(74) *Attorney, Agent, or Firm* — Sand, Sebolt & Wernow LPA; Gary McFaline (57) ABSTRACT

Techniques, a system, and architecture are disclosed for top side transistor heat dissipation. The heat dissipation is done through single crystal epitaxially grown layer such as AlN. The architecture may include a back side heat sink to increase thermal dissipation as well. The architecture may further include a pseudomorphic channel layer that is lattice matched to the substrate.

17 Claims, 4 Drawing Sheets

(51) Int. Cl.
*H01L 29/10* (2006.01)
*H01L 29/66* (2006.01)
*H01L 29/15* (2006.01)

(58) Field of Classification Search
CPC ............. H01L 21/022; H01L 21/02301; H01L 21/02208; H01L 21/02205; H01L 21/02225; H01L 21/0229; H01L 21/2123; H01L 21/0217; H01L 21/28114; H01L 21/67063; H01L 21/768; H01L 21/823468; H01L 21/823864; H01L 21/823456; H01L 21/82385
USPC .......................... 257/183, 76, 190, 194, 192
See application file for complete search history.

(56) References Cited

U.S. PATENT DOCUMENTS

| | | | |
|---|---|---|---|
| 2005/0201061 A1 | 9/2005 | Nikfar | |
| 2006/0040104 A1 | 2/2006 | Wort et al. | |
| 2007/0164322 A1* | 7/2007 | Smith | H01L 29/42312 257/256 |
| 2009/0078943 A1 | 5/2009 | Ishida et al. | |
| 2009/0159930 A1* | 6/2009 | Smorchkova | H01L 29/7787 257/E21.403 |
| 2009/0174063 A1 | 7/2009 | Furukawa et al. | |
| 2012/0193677 A1* | 8/2012 | Parikh | H01L 29/2003 257/190 |
| 2014/0231815 A1 | 8/2014 | Railkar et al. | |
| 2015/0076511 A1 | 3/2015 | Okamoto et al. | |
| 2015/0208550 A1 | 7/2015 | Rugg | |
| 2016/0247745 A1* | 8/2016 | Perkins | H01L 29/42304 |
| 2017/0125561 A1* | 5/2017 | Makiyama | H01L 29/517 |
| 2018/0286972 A1* | 10/2018 | Tarakji | H01L 29/4236 |
| 2020/0044067 A1* | 2/2020 | Banerjee | H01L 21/02271 |
| 2020/0176389 A1* | 6/2020 | Huang | H01L 29/42316 |
| 2020/0294881 A1 | 9/2020 | Chiu et al. | |
| 2020/0343156 A1* | 10/2020 | Okamoto | H01L 21/6835 |
| 2023/0014905 A1* | 1/2023 | Takeuchi | H01L 27/0605 |

OTHER PUBLICATIONS

International Search Report, PCT/US21/54091, dated Jan. 10, 2022, 8 pages.

N. Yafune, S. Hashimoto, K. Akita, Y. Yamamoto, H. Tokuda, & M. Kuzuhara, Aln/AlGan HEMTs on AIN Substrate for Stable High-temperature Operation, The Institution of Engineering and Technology 2014, Aug. 30, 2013, pp. 211-212, vol. 50 No. 3.

Austin Hickman, Reet Chaudhuri, Samuel James Badder, Kazuki Nomoto, Kevin Lee, Huili Grace King, & Debjeep Jena, High Breakdown Voltage in RF AlN/GaN/AlN Quantum Well HEMTs, IEEE Electronic Device Letters, Aug. 2019, pp. 1293-1296, vol. 40 No. 8.

* cited by examiner

III-NITRIDE THERMAL MANAGEMENT BASED ON ALUMINUM NITRIDE SUBSTRATES

TECHNICAL FIELD

This disclosure generally relates to a thermal management device grown epitaxially on top of a substrate. Particularly, this disclosure relates to a thermal management device within a package that is grown epitaxially on top of a substrate and used in conjunction with a backside heatsink. Specifically, this disclosure relates to methods, apparatuses, and systems using an expitaxial layer of aluminum nitride grown on top of a substrate to dissipate heat through the top of a transistor.

BACKGROUND

Desired RF power output for solid-state systems may result in catastrophic transistor failure and unmanageable junction temperatures without proper heat dissipation. Traditional III-N (so named as they comprise one or more group III elements and nitrogen) high-electron-mobility transistors (HEMTs), such as aluminum nitride (AlN), gallium nitride (GaN), indium nitride (InN), and their ternary and quaternary alloys, rely on a GaN channel which is typically grown on a metamorphic GaN buffer layer on a non-native substrate. The GaN film is grown thicker to annihilate threading dislocations until the epitaxial film is of high quality for the charge transport layer. The active device channel and barrier layers are grown pseuodomorphically onto the GaN lattice. There are ternary and quaternary barrier layers that can achieve lattice match to GaN as a barrier layer. However, in these alloys result in charge scattering and phonon scattering.

Many solutions for thermal spreading have been proposed for GaN. They include utilizing diamond and AlN as heat spreaders and backside heatsinks. Backside, single crystal solutions are achievable through wafer bonding. However, there are no wafer bonding solutions for topside heat spreaders that do not result in RF losses or device damage. All attempts to apply topside epitaxial heat spreader solutions to date result in amorphous, nanocrystalline, or polycrystalline layers where thermal transport is compromised. In current material systems, which are lattice-fit to GaN, AlN can only be grown a few nm thick before it completely relaxes and thermal transport is compromised.

SUMMARY

The present disclosure addresses these and other issues by providing techniques, systems, and architecture for top side transistor heat dissipation for III-N devices. The heat dissipation is done through single crystal epitaxially grown AlN. The architecture may include a back side heat sink as well to increase dissipation as well. The architecture may further include a pseudomorphic channel layer that is lattice matched to the substrate.

In one aspect, an exemplary embodiment of the present disclosure may provide an apparatus for dissipating heat comprising: a substrate; a channel layer on a top side of the substrate; a barrier layer on a top side of the channel layer; an epitaxially grown layer on top of at least a portion of the barrier layer, wherein the epitaxially grown layer is operative to disperse heat from a contact touching at least the epitaxially grown layer. This embodiment or an alternative embodiment may provide an etch stop layer on a top of the barrier layer; an etched region on top of the etch stop layer. This embodiment or an alternative embodiment may provide a material deposited within the etched region. This embodiment or an alternative embodiment may provide the material is a material with a relative dielectric constant less than or equal to a relative dielectric constant of silicon dioxide. This embodiment or an alternative embodiment may provide the material has a relative dielectric constant of less than 3.9. This embodiment or an alternative embodiment may provide the substrate is a III-N material. This embodiment or an alternative embodiment may provide the channel layer is of a different material than the substrate and is lattice matched to a lattice structure of the substrate. This embodiment or an alternative embodiment may provide the channel layer comprises pseudomorphic gallium nitride. This embodiment or an alternative embodiment may provide the epitaxially grown layer comprises single crystalline aluminum nitride. This embodiment or an alternative embodiment may provide a heat sink located on the rear of the substrate.

In another aspect, an exemplary embodiment of the present disclosure may provide a method for fabricating a transistor comprising: depositing a channel layer on top of a substrate; depositing a barrier layer on top of the channel layer; inserting a contact in contact with the barrier layer; growing epitaxially a lateral layer on top of the barrier layer whereby the lateral layer is operative to dissipate heat from the contact via a top side of the transistor. This embodiment or an alternative embodiment may provide prior to growing, providing an etch stop layer on top of the barrier layer. This embodiment or an alternative embodiment may provide providing a sacrificial layer on top of the etch stop layer. This embodiment or an alternative embodiment may provide removing the sacrificial layer until the etch stop layer thereby creating an etched region. This embodiment or an alternative embodiment may provide depositing a material onto the etched region. This embodiment or an alternative embodiment may provide providing a heat sink that attaches to the rear of the substrate. This embodiment or an alternative embodiment may provide providing a heat sink that attaches to the rear of the substrate. This embodiment or an alternative embodiment may provide prior to depositing a channel layer: matching a lattice structure of the substrate to a lattice structure of the channel layer.

In another aspect, an exemplary embodiment of the present disclosure may provide a heat dissipation system comprising: a substrate adapted to be coupled to a package; a channel layer on a top side of the substrate; a barrier layer on a top side of the channel layer; an epitaxially grown layer on top of at least a portion of the barrier layer, wherein the epitaxially grown layer is operative to disperse heat from a contact touching at least the epitaxially grown layer an RF system adapted to accept the heat dissipation system. This embodiment or an alternative embodiment may provide a rear side heat extractor.

BRIEF DESCRIPTION OF THE SEVERAL VIEWS OF THE DRAWINGS

Sample embodiments of the present disclosure are set forth in the following description, are shown in the drawings and are particularly and distinctly pointed out and set forth in the appended claims.

Similar numbers refer to similar parts throughout the drawings.

DETAILED DESCRIPTION

A new transistor structure 10 and method of manufacture and operation thereof is depicted in the present disclosure and throughout FIGS. 1-5. The transistor structure 10 is a new and improved apparatus, as will be discussed and described hereafter.

Figure 1:
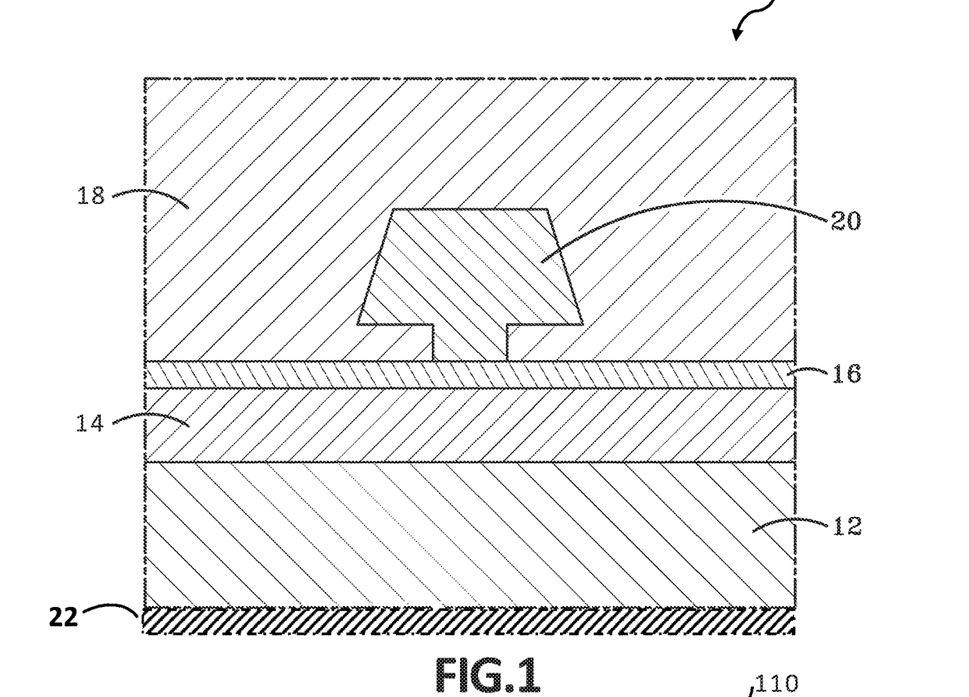
FIG. 1 (FIG. 1) is a side view of a cross-section for a first embodiment of a transistor structure.

Referring specifically to FIG. 1, a side view of a cross-section for a first embodiment of a transistor structure 10 in accordance with the present disclosure is shown. Generally, the transistor 10 is a majority carrier (electron), gate voltage controlled device (i.e., a field effect transistor or "FET") commonly referred to as a high-electron-mobility transistors (HEMT) (while depicted as planar for clarity, it is appreciated that known techniques may also be applied to achieve a non-planar transistor).

Shown in the transistor structure 10 are a plurality of layers including a substrate 12, a pseudomorphic transport layer or channel layer 14, barrier layer 16 and a lateral growth layer 18. The substrate 12 abuts against and is on top of the pseudomorphic transport layer 14. The pseudomorphic transport layer 14 abuts against and is on top of the substrate 12 and the barrier layer 16. The barrier layer 16 abuts against and is on top of the pseudomorphic transport layer 14 and the lateral growth layer 18, while the lateral growth layer 18 abuts against and is on top of the barrier layer 16. Further included is a contact 20. The contact 20 is located within the lateral growth layer 18 and abuts the barrier layer 16. The contact 20 may be any known electrical contact and may be electrically coupled to any device or other contact or device as known in the art and as dictated by the desired implementation. In the exemplary embodiments, the lateral growth layer 18 is substantially single crystalline. Although the lateral growth layer 18 is referred to herein as "monocrystalline" or "crystalline", one of ordinary skill will appreciate that a low level of crystal defects may nevertheless be present as artifacts of an imperfect epitaxial growth processes though the goal is perfect crystalline structure.

In one embodiment, the substrate 12 is made of AlN, but may be made of any III-N material. Of all binary materials with large bandgap, AlN has one of, if not the highest thermal conductivity that can serve as a native substrate for III-N based devices. According to another aspect, the substrate may also be made of boron nitride (BN). Further, the pseudomorphic transport layer or channel layer 14 in one embodiment is made of GaN. The thin pseudomorphic transport layer 14 allows for aggressive scaling and high frequency performance. In an alternative embodiment the channel layer 14 is indium nitride (InN). In the pseudomorphic transport layer 14 the layer laterally strained (extended or compressed) in order to matched the lattice of the crystalline substrate. In further alternative embodiments, the channel layer 14 is a ternary alloy of GaN, such as aluminum gallium nitride ($Al_xGa_{1-x}N$ where x is an integer greater than 2), a ternary alloy of InN, such as aluminum indium nitride ($Al_xIn_{1-x}N$, where x is an integer greater than 2) or a quaternary alloy including at least one group III element and nitrogen, such as $In_xAl_yGa_{1-x-y}N$, where x+y are greater than 2.

Generally, any III-N materials may be utilized for the barrier layer 16, as the barrier layer 16 choice is dependent on the III-N material selected for the channel layer 14 to provide the barrier layer 16 with a larger bandgap than the channel layer 14. In an exemplary embodiment, the barrier layer 16 is substantially monocrystalline and lattice matched to the III-N material utilized in the channel layer 14. In the exemplary embodiment, the barrier layer 16 is of a second III-N material having the same crystallinity as that of the channel layer 14 to form a heterointerface.

The lateral growth layer 18 in the exemplary embodiment is at least one thick layer of single crystal AlN to be grown epitaxially on top of at least a portion of the barrier layer 16 and contact 20 by a number of methods. In an exemplary embodiment, when using an AlN substrate, rather than GaN, the lateral growth layer 18 can be grown arbitrarily thick. When you have a pseudomorphic GaN layer 14, the lateral growth layer can be as thick as the desired implementation requires it to be. For example, in one embodiment the lateral growth layer is 1 nm or greater. In another embodiment it may be 10 nm or greater. In yet another embodiment it may be 100 nm or greater. In further embodiments it may be 1 mm or greater. Prior art may only allow for 3 nm growth before the AlN would completely relax resulting in cracking of the layer.

Epitaxy refers to a type of crystal growth or material deposition in which new crystalline layers are formed with a well-defined orientation with respect to the crystalline substrate. The new layers formed are called the epitaxial film or epitaxial layer. The relative orientation of the epitaxial layer to the crystalline substrate is defined in terms of the orientation of the crystal lattice of each material. For epitaxial growth, the new layer will be crystalline and will all have a single orientation relative to the substrate; amorphous growth or multicrystalline growth with random crystal orientation does not meet this criterion. These methods to get epitaxial growth include, but are not limited to, chemical vapor deposition (CVD), hydride vapor phase epitaxy (HVPE), liquid phase epitaxy (LPE), sputtering, pulled laser deposition (PLD), or other such deposition or epitaxy techniques. The growth or deposition occurs in a gate to drain region of a transistor or anywhere there is open semiconductor space between electrodes.

Ideally, a single crystal material would be deposited in intimate contact with the electrodes and the gate-to-drain region where the largest thermal gradient occurs. In current material systems, which are lattice-fit to GaN, AlN can only be grown a few nm before it completely relaxes and thermal transport will be compromised. Using AlN as the substrate 12 enables thick layers of AlN as the lateral growth layer 18 to be grown on top of the pseudomorphic GaN as the channel layer 14, or on other layers such as the barrier layer 16, and allow the lateral growth layer 18 to completely surround the device area at the point of heat generation. AlN is a very good electrical insulator and will not induce breakdown under high voltage or high power operation of an electronic device. In this embodiment or another alternative embodiment, with the right combination of materials lateral epitaxial overgrowth can be used to strategically "encapsulate" metal contacts, such as contact 20. Ideally, a single crystal material would be deposited in intimate contact with electrodes and gate-to-drain region where the largest thermal gradient occurs. This solution provides a way to reduce thermal resistivity at the transistor level for better thermal management by spreading heat more efficiently away from the junction where heat is created. After a standard HEMT is grown, including barrier layers, AlN may be grown in as layer 18. AlN has a large lattice mismatch with AlN and prior attempts result in cracking, highly amorphous growing or polycrystalline in nature leading to inferior thermal conductivity.

Current backside heat extraction using the AlN substrate (or other substrates) and the community at large does not typically attempt topside thermal solutions because they interfere with high frequency operation and device or MMIC fabrication. The presently disclosed single crystal AlN layer as the lateral growth layer 18 may interfere with high frequency operation as it can act as an insulator and AlN has a dielectric constant around 10.

Figure 2:
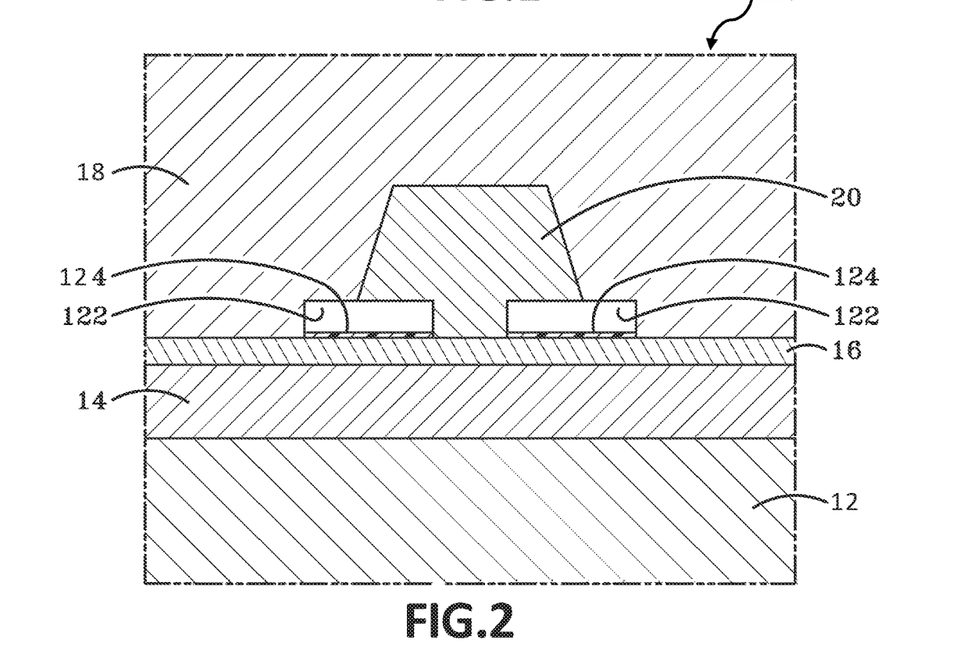
FIG. 2 (FIG. 2) is a side view of a cross-section for a second embodiment of a transistor structure.

Referring to FIG. 2, a side view of a cross-section for a second embodiment of a transistor structure 110 is shown. The second embodiment is generally similar to the first embodiment with a few noted differences. The second embodiment 110 includes an etched region 122 and an etch stop layer 124. The barrier layer 16 abuts against and is on top of the pseudomorphic transport layer 14, the etched region 122, and the lateral growth layer 18, while the lateral growth layer 18 abuts against and is on top of the barrier layer 16, and the etched region 122. The contact 20 abuts a portion of the etched region 122 is located within the lateral growth layer 18 and abuts the barrier layer 16.

As described below with respect to operation, the etched region 122 is created by surface cleaning an intermediate sacrificial layer (not shown). The etch is selectivity achieved between the layers, therefore the composition of the etch is tailored to the composition of the layers so as to remove the sacrificial layer but not harm the rest of the other layers or package. Surface cleaning may be performed by sputter-etching, chemical etching, reactive gas etching or ion milling. For example, the native oxide of silicon may be removed with a hydrofluoric acid dip, while GaAs is more typically cleaned by a bromine-methanol dip. The resultant ohmic areas can be etched all the way through for ohmic regrowth, and a window can be etched down to the etch stop layer 124 for gate placement. This would result in a device that is completely encapsulated in a layer of single crystal AlN 18. The etched region 122 allows removal of the dielectric and a reduction in the parasitic capacitance.

The ohmic region of a FET transistor (also called the linear region) is the region where the drain current has a linear response to changes in the drain-source voltage which mimics the linear response that would be obtained from Ohm's Law. The drain current depends on the drain-source voltage. Right at the beginning of the curve, when the drain-source voltage is small, the drain current varies nearly linearly with the drain-source voltage. The ohmic region is the only region on a FET characteristics curve where there is a linear response in current from changes in the voltage.

Figure 3:
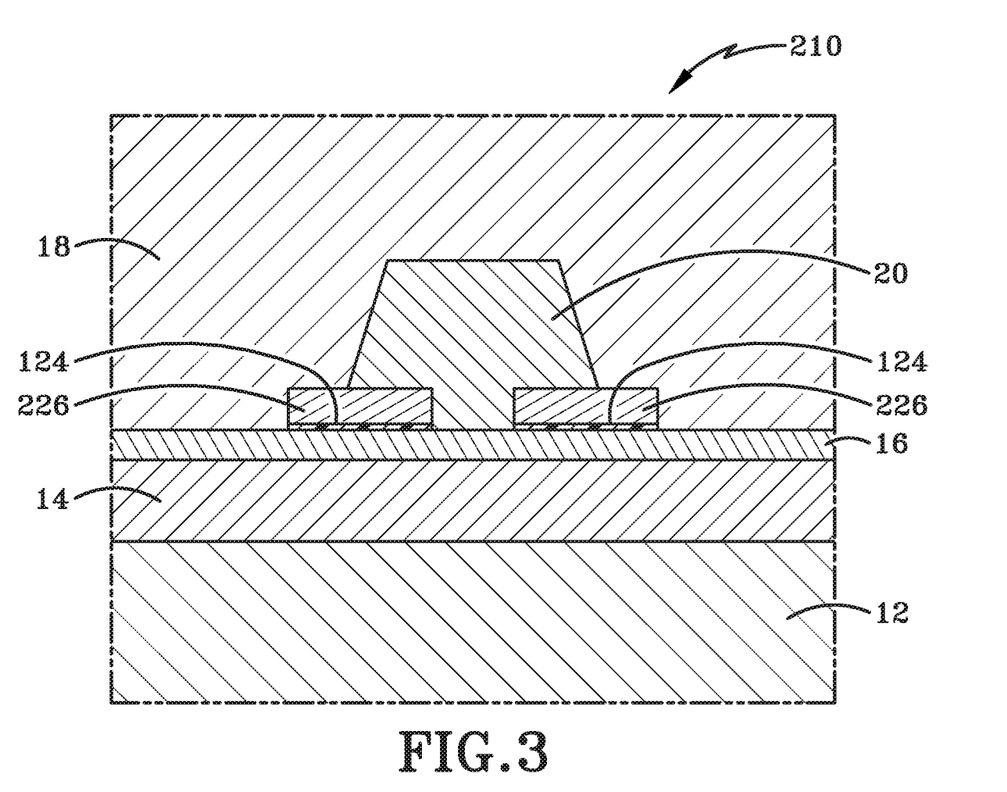
FIG. 3 (FIG. 3) is a side view of a cross-section for a third embodiment of a transistor structure.

Referring to FIG. 3, a third embodiment a side view of a cross-section for a third embodiment of a transistor structure 210 is shown. The third embodiment is generally similar to the first embodiment and second embodiment with a few noted differences. The barrier layer 16 abuts against and is on top of the pseudomorphic transport layer 14, the etched region 122, and a material 226 within the etched region 122, and the lateral growth layer 18. The lateral growth layer 18 abuts against and is on top of the barrier layer 16, the etched region 122 and the material 226 within the etched region 122. The contact 20 abuts a portion of the etched region 122 and the material 226 and is located within the lateral growth layer 18 and abuts the barrier layer 16. Further, in an alternative embodiment an additional material via a layer over the contact 20 grown around and subsequently etched around it, or even used as a sacrificial layer to create an air gap as is discussed in the prior embodiment.

After cleaning the intermediate sacrificial layer (not shown), as discussed with the second embodiment, materials can be deposited via sputter deposition (sputtering), evaporation, or chemical vapor deposition (CVD). Sputtering is generally a faster and more a convenient method of metal deposition than evaporation; however, ion bombardment from the plasma may induce surface states or even invert the charge carrier type at the surface. For this reason, the gentler CVD is used more often. Because deposited metals can oxidize in ambient conditions, to the detriment electrical properties of the contacts, it is common to form ohmic contacts with layered structures.

Further, when the etched region is removed, it can be replaced with adding a relatively low dielectric material 226. A relatively low dielectric material 226, as used herein, is a material with a smaller relative dielectric constant relative to silicon dioxide. The relative dielectric constant of silicon dioxide is the ratio of the permittivity of silicon dioxide divided by the permittivity of a vacuum, which is 3.9. Using a relatively low dielectric material 226 reduces parasitic capacitance. Some examples of relatively low dielectric materials include, but are not limited to, fluorine doped silicone dioxide, organosilicate glass, pourous silicon dioxide, porous organosilicate glass, spin-on organic polymeric dielectrics including: polyimides, polynorbornenes, benzocyclobutenes, and polytetrafluoroethylenes, and spin-on silicone based polymeric dielectrics including: hydrogen silsesquioxane and methylsilsesquioxane. According to another aspect, the relatively low dielectric material 226 can be air; however, air can cause mechanical instability if used too frequently within the package as a whole. Low permittivity dielectrics can also be added adjacent to gates or other sensitive areas within the package. In some embodiments the relatively low dielectric material 226 may have a dielectric constant less than 10.

Having thus described exemplary non-limiting configurations of the transistor 10, 110, and 210, a method of fabrication and its operation with respect to use within a system will be discussed with reference to some exemplary features used with the various embodiments.

Figure 4:
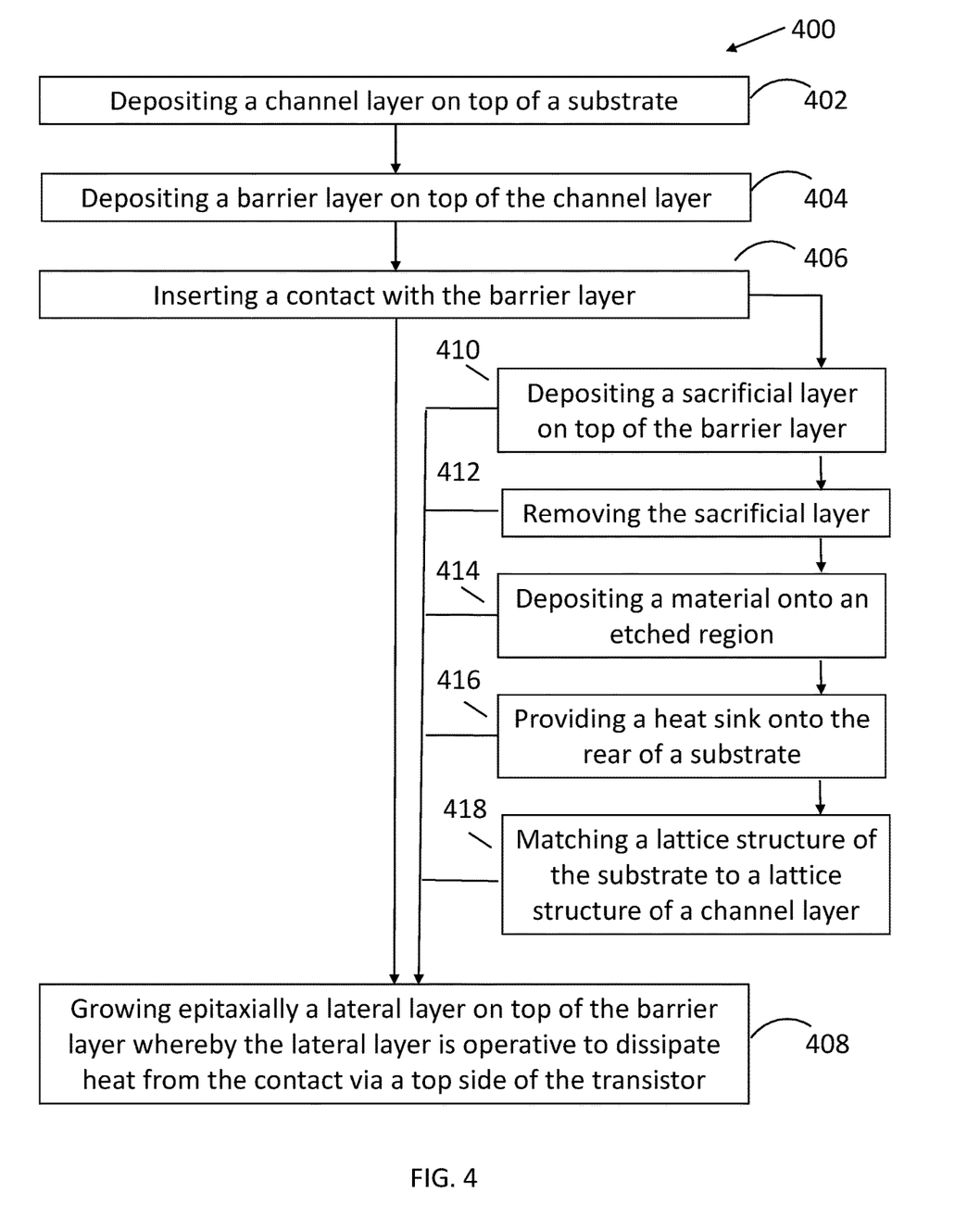
FIG. 4 (FIG. 4) is a flow chart of exemplary method steps.

Referring specifically to FIG. 4, an exemplary flow chart of a method 400 of fabricating a transistor 10, is shown and described. First, a channel layer 14 is deposited 402 onto the substrate 12. Then, the barrier layer 16 is deposited 404 abutting the channel layer 14. The contact 20 is provided 406 and abuts the barrier layer 16. The lateral growth layer 18 is then grown 408 epitaxially over the contact 20 and the barrier layer 16.

A method of fabricating a transistor 110 additionally includes an etched region 122 and an etch stop layer 124. The etch stop layer 124 and the sacrificial layer is deposited 410 on top of the barrier layer 16. The sacrificial layer is then removed 412, creating the etched region 122. The lateral growth layer 18 is then grown 408 over top of the contact so that the contact 20 abuts against and is on top of the etched region 122, within the lateral growth layer 18, and abuts the barrier layer 16. Generally, the layers 12, 14, 16 are deposited or provided prior to placing a contact 20 and the lateral growth layer 18 may be deposited after the contact has been placed.

A method of fabricating a transistor 210 further includes the barrier layer 16 that abuts against the pseudomorphic transport layer 14, the etched region 122, the material 226 within the etched region 122, and the lateral growth layer 18. The lateral growth layer 18 abuts against the barrier layer 16, the etched region 122 and the material 124 within the etched region 122. The contact 20 is located abuts against and is on top of the etched region 122 and within the lateral growth layer 18 and abuts the barrier layer 16. The material 226 is added 414 to the transistor 210 structure. The material may be added 416 via a number of methods including, adding the material prior to growing the lateral growth layer 16, creating an aperture within the lateral growth layer 18 in which to deposit the material, or by other known methods.

After a top side heat sink via the lateral growth layer 18 on top of the transistor structure 10, 110, 210 has been created, a rear side heat sink (Item 22 in FIG. 1 and Item 416 in FIG. 4), as used in the art, may be added to the transistor. Such a rear side heat sink structure would further increase the heat dissipation ability and promote greater heat dissipation to allow parts containing the transistor, to have longer usable life.

Figure 5:
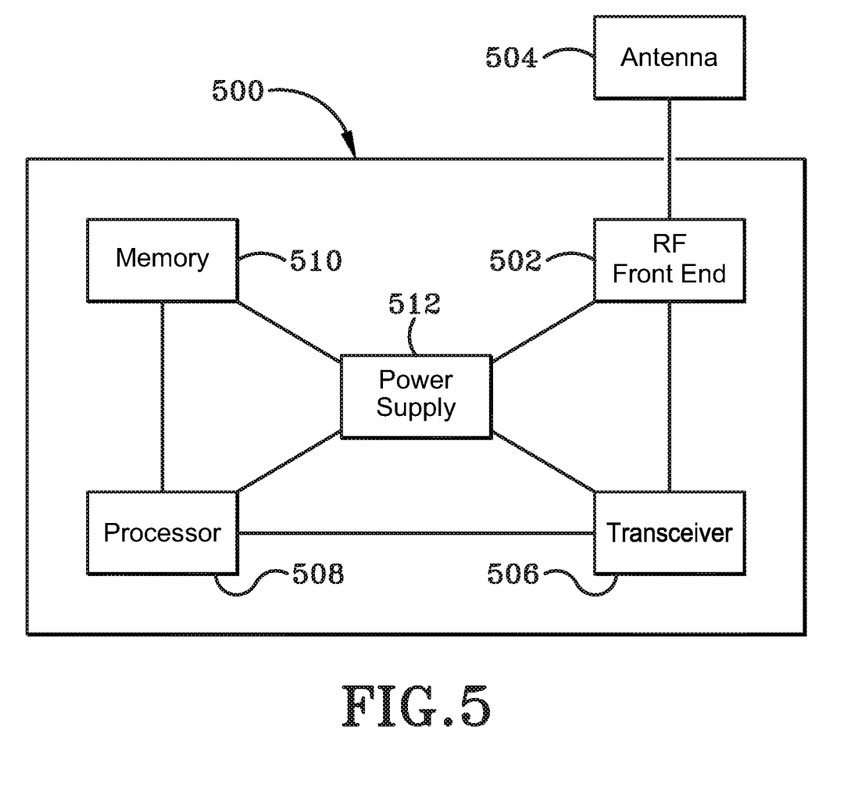
FIG. 5 (FIG. 5) is a top plan view of an exemplary system.

The packages described herein may be particularly suitable for HEMTs that are incorporated into radio frequency (RF) systems for power management or power amplification at various frequencies. FIG. 5 is a block diagram of an exemplary RF system 500 in accordance with various embodiments. The RF system 500 may be a wireless communication device that has an RF front-end 502 that includes various components, as necessary, to facilitate transmission or reception of RF signals. The components could include, but are not limited to, an antenna switch module, a transmitter, a receiver, an amplifier, a converter, a filter, etc.

In addition to the RF front-end 502, the RF system 500 may have an antenna 504, a transceiver 506, a processor 508, and a memory 510 coupled with each other as shown, or additionally coupled in a way known to those skilled in the art. The RF system 500 may further include a power supply 512 coupled to one or more of the other components to provide appropriate power thereto. In various embodiments, HEMTs (or other devices) packaged in accordance the present teachings may be employed in a power management application of the power supply 512, an amplification application of the RF front-end 502, or other in applications.

In various embodiments, the wireless communication device 500 may be, but is not limited to, a mobile telephone, a paging device, a personal digital assistant, a text-messaging device, a portable computer, a desktop computer, a base station, a subscriber station, an access point, a radar, a satellite communication device, or any other device capable of wirelessly transmitting/receiving RF signals.

In another embodiment, the device 500 is an optical device, specifically a UV emitter. AlN is transparent below 6.2 eV or above about 200 nm. Further, optical devices typically have poor ohmic contacts resulting in heat dissipation and could benefit from the use of AlN grown epitaxially.

Various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of technology disclosed herein may be implemented using hardware, software, or a combination thereof. When implemented in software, the software code or instructions can be executed on any suitable processor or collection of processors, whether provided in a single computer or distributed among multiple computers. Furthermore, the instructions or software code can be stored in at least one non-transitory computer readable storage medium.

Also, a computer or smartphone utilized to execute the software code or instructions via its processors may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers or smartphones may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes outlined herein may be coded as software/instructions that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, USB flash drives, SD cards, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the disclosure discussed above. The computer readable medium or media can be transportable, such that the program or programs stored thereon can be loaded onto one or more different computers or other processors to implement various aspects of the present disclosure as discussed above.

The terms "program" or "software" or "instructions" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present disclosure need not reside on a single computer or processor, but may be distributed in a modular fashion amongst a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

All definitions, as defined and used herein, should be understood to control over dictionary definitions, definitions in documents incorporated by reference, and/or ordinary meanings of the defined terms.

"Logic", as used herein, includes but is not limited to hardware, firmware, software and/or combinations of each to perform a function(s) or an action(s), and/or to cause a function or action from another logic, method, and/or system. For example, based on a desired application or needs, logic may include a software controlled microprocessor, discrete logic like a processor (e.g., microprocessor), an application specific integrated circuit (ASIC), a programmed logic device, a memory device containing instructions, an electric device having a memory, or the like. Logic may include one or more gates, combinations of gates, or other circuit components. Logic may also be fully embodied as software. Where multiple logics are described, it may be possible to incorporate the multiple logics into one physical logic. Similarly, where a single logic is described, it may be possible to distribute that single logic between multiple physical logics.

Furthermore, the logic(s) presented herein for accomplishing various methods of this system may be directed towards improvements in existing computer-centric or internet-centric technology that may not have previous analog versions. The logic(s) may provide specific functionality directly related to structure that addresses and resolves some problems identified herein. The logic(s) may also provide significantly more advantages to solve these problems by providing an exemplary inventive concept as specific logic structure and concordant functionality of the method and system. Furthermore, the logic(s) may also provide specific computer implemented rules that improve on existing technological processes. The logic(s) provided herein extends beyond merely gathering data, analyzing the information, and displaying the results. Further, portions or all of the present disclosure may rely on underlying equations that are derived from the specific arrangement of the equipment or components as recited herein. Thus, portions of the present disclosure as it relates to the specific arrangement of the components are not directed to abstract ideas. Furthermore, the present disclosure and the appended claims present teachings that involve more than performance of well-understood, routine, and conventional activities previously known to the industry. In some of the method or process of the present disclosure, which may incorporate some aspects of natural phenomenon, the process or method steps are additional features that are new and useful.

The articles "a" and "an," as used herein in the specification and in the claims, unless clearly indicated to the contrary, should be understood to mean "at least one." The phrase "and/or," as used herein in the specification and in the claims (if at all), should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "above", "behind", "in front of", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal", "lateral", "transverse", "longitudinal", and the like are used herein for the purpose of explanation only unless specifically indicated otherwise.

Although the terms "first" and "second" may be used herein to describe various features/elements, these features/elements should not be limited by these terms, unless the context indicates otherwise. These terms may be used to distinguish one feature/element from another feature/element. Thus, a first feature/element discussed herein could be termed a second feature/element, and similarly, a second feature/element discussed herein could be termed a first feature/element without departing from the teachings of the present invention.

An embodiment is an implementation or example of the present disclosure. Reference in the specification to "an embodiment," "one embodiment," "some embodiments," "one particular embodiment," "an exemplary embodiment," or "other embodiments," or the like, means that a particular feature, structure, or characteristic described in connection with the embodiments is included in at least some embodiments, but not necessarily all embodiments, of the invention. The various appearances "an embodiment," "one embodiment," "some embodiments," "one particular embodiment," "an exemplary embodiment," or "other embodiments," or the like, are not necessarily all referring to the same embodiments.

If this specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), etc. Any numerical range recited herein is intended to include all sub-ranges subsumed therein.

Additionally, the method of performing the present disclosure may occur in a sequence different than those described herein. Accordingly, no sequence of the method should be read as a limitation unless explicitly stated. It is recognizable that performing some of the steps of the method in a different order could achieve a similar result.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of various embodiments of the disclosure are examples and the disclosure is not limited to the exact details shown or described.

The invention claimed is:
1. An apparatus for dissipating heat comprising:
a substrate;
a channel layer directly on a top side of the substrate;
a barrier layer on a top side of the channel layer;
a contact on a portion of the barrier layer;
a single-crystal epitaxially grown layer on a top of at least a portion of the barrier layer, wherein the epitaxially grown layer is operative to disperse heat from the contact touching at least the epitaxially grown layer;
an etch stop layer on a top of a portion of the barrier layer; and
an etched region on a top of the etch stop layer;
wherein a portion of the contact is on a top of the etched region and the etch stop layer.

2. The apparatus of claim 1, further comprising:
a material deposited within the etched region.

3. The apparatus of claim 2, wherein the material comprises a dielectric constant less than 10.

4. The apparatus of claim 3, wherein the material has a relative dielectric constant of less than 3.9.

5. The apparatus of claim 1, wherein the substrate is a III-N material.

6. The apparatus of claim 1, wherein the channel layer is of a different material than the substrate and is lattice matched to a lattice structure of the substrate.

7. The apparatus of claim 1, wherein the channel layer comprises pseudomorphic gallium nitride.

8. The apparatus of claim 1, wherein the epitaxially grown layer comprises single crystalline aluminum nitride.

9. The apparatus of claim 1, further comprising:
a heat sink located on a rear of the substrate.

10. A method for fabricating a transistor comprising:
depositing a channel layer directly on a top of a substrate;
depositing a barrier layer on a top of the channel layer;
inserting a contact proximate with the barrier layer;
growing epitaxially a single-crystal lateral layer on top of at least a portion of the barrier layer whereby the lateral layer is operative to dissipate heat from the contact
and wherein prior to epitaxially growing the single-crystal lateral layer, providing an etch stop layer on a top of a portion of the barrier layer; and
providing a sacrificial layer on a top of the etch stop layer, wherein a portion of the contact is on top of the barrier layer and the etch stop layer.

11. The method of claim 10, further comprising:
removing the sacrificial layer until the etch stop layer thereby creating an etched region.

12. The method of claim 11, further comprising:
depositing a material onto the etched region.

13. The method of claim 12, further comprising:
providing a heat sink that attaches to a rear of the substrate.

14. The method of claim 10 further comprising:
providing a heat sink that attaches to a rear of the substrate.

15. The method of claim 10 further comprising:
prior to depositing the channel layer:
matching a lattice structure of the substrate to a lattice structure of the channel layer.

16. A heat dissipation system comprising:
a substrate adapted to be coupled to a package;
a channel layer directly on a top side of the substrate;
a barrier layer on a top side of the channel layer;
a single-crystal epitaxially grown layer on a top of at least a portion of the barrier layer, wherein the epitaxially grown layer is operative to disperse heat from a contact touching at least the epitaxially grown layer;
a radio frequency (RF) system adapted to accept the heat dissipation system;
an etch stop layer on a top of a portion of the barrier layer;
an etched-region on a top of the etch stop layer and
a contact on a top of a potion of the etched region and the etch stop layer.

17. The system of claim 16, further comprising:
a rear side heat extractor.

* * * * *